United States Patent [19]

Teshima et al.

[11] Patent Number: 6,097,036
[45] Date of Patent: Aug. 1, 2000

[54] SEMICONDUCTOR LOGIC ELEMENT AND APPARATUS USING THEREOF

[75] Inventors: Tatsuya Teshima, Sagamihara, Japan; Hiroshi Mizuta, Milton, United Kingdom; Ken Yamaguchi, Fuchu, Japan

[73] Assignee: Hitachi, LLP, Tokyo, Japan

[21] Appl. No.: 08/913,189

[22] PCT Filed: Mar. 8, 1995

[86] PCT No.: PCT/JP95/00375

§ 371 Date: Sep. 8, 1997

§ 102(e) Date: Sep. 8, 1997

[87] PCT Pub. No.: WO96/27906

PCT Pub. Date: Sep. 12, 1996

[51] Int. Cl.[7] .......................... H01L 29/06; H01L 29/201
[52] U.S. Cl. ................................... 257/26; 257/9; 257/12; 326/38; 326/135
[58] Field of Search ............................... 257/26–27, 8–9, 257/29, 192, 194, 12; 326/37–38, 54, 135

[56] References Cited

U.S. PATENT DOCUMENTS 4,999,687  3/1991  Luryi et al. ........................ 257/192 X

OTHER PUBLICATIONS

Luryi et al., "Charge Injection Transistors and Logic Circuits", Superlattices and Microstructures, vol. 8, No. 4, Jan. 1, 1990, pp. 395–404.

Mori et al., "A Proposal of a SRAM Using Multi–Emitter RHETs and Growth of Nanostructures for its Development", Extended Abstracts of the 13th Symposium on Future Electron Devices, Oct. 24–25, 1994, pp. 47–52.

Mastrapasqua, et al., "Multiterminal Light–Emitting Logic Device Electrically Reprogrammable Between OR and NAND Functions," IEEE Trans. Electon Devices, vol. 40, No. 8, Aug. 1993, pp. 1371–1377.

Tanenbaum, A. S., "Structured Computor Organization," 3rd. ed., 1990, pp. 80–83.

*Primary Examiner*—John Guay
*Attorney, Agent, or Firm*—Antonelli, Terry, Stout & Kraus, LLP

[57] ABSTRACT

A semiconductor logic element is provided which is capable of a plurality of logic operations. The semiconductor logic element includes a semiconductor substrate on which is disposed at least three control electrodes and an output electrode for outputting signals in response to inputs to said control electrodes, making it possible to significantly reduce the number of elements constituting a logic circuit and to provide high speed processors and electronic computers. Logic circuitry and apparatus using the semiconductor logic elements are also provided.

26 Claims, 16 Drawing Sheets

FIG.3

| 51 | L | H | L | H | L | H | L | H |
|---|---|---|---|---|---|---|---|---|
| 52 | L | L | H | H | L | L | H | H |
| 53 | L | L | L | L | H | H | H | H |
| collector | H | L | L | L | L | H | H | H |

NOR — OR

FIG.8

| 51 | L | H | L | H | L | H | L | H |
|---|---|---|---|---|---|---|---|---|
| 52 | L | L | H | H | L | L | H | H |
| 53 | L | L | L | L | H | H | H | H |
| 54 | L | L | L | L | H | H | H | H |
| collector | H | L | L | L | L | H | H | H |

NOR     OR

FIG.9

| 54 | L | H | L | H |
|---|---|---|---|---|
| 53 | L | L | H | H |
| 52 | H | H | H | H |
| 51 | H | H | H | H |
| collector | L | L | L | H |

AND

FIG.10

| 51 | L | H | L | H |
|---|---|---|---|---|
| 53 | L | L | H | H |
| 52 | L | L | L | L |
| 54 | L | L | L | L |
| collector | H | L | L | H |

EXNOR

FIG.11

| 51 | L | H | L | H |
|---|---|---|---|---|
| 53 | L | L | H | H |
| 52 | L | L | L | L |
| 54 | L | L | L | L |
| collector | H | L | L | H |

NOT  through

SEMICONDUCTOR LOGIC ELEMENT AND APPARATUS USING THEREOF

BACKGROUND OF THE INVENTION

1. Field of the Invention

The present invention relates to a semiconductor logic element and apparatus using the element, and, in particular, relates to a semiconductor logic device that can be comprised of one such logic element. The present invention also relates to equipment such as microprocessors and electronic computers utilizing such logic elements.

2. Description of Related Art

In the conventional art, a microprocessor unit (MPU) is comprised of a plurality of logic gates arranged in combination. Each logic gate is composed, for instance, of a plurality of transistors. For example, when utilizing emitter coupled logic (ECL) circuits to make up logic circuits comprised of NOR gates, one of the most basic logic elements, a circuit as shown in FIG. 24 containing 13 transistors and 16 passive elements (resistors and diodes) is used. Here "Vcc" indicates the power supply voltage terminal, while "a" and "b" are the input terminals. Also in FIG. 24, "a·b" is the AND output of the input "a" and the input "b", while "$\overline{a+b}$" is the NOR output of the inputs "a" and "b", and "$\overline{a}$" is the NOT output of "a".

The MPU circuit configuration has an unsystematic arrangement with the many wires making multilayer wiring technology a necessity and further problems such as delay time and stray capacitance in the wiring making sophisticated countermeasures essential. These factors serve to make logic design complicated and interfere with MPU high speed, high performance operation. As graphical user interfaces (GUI) such as utilized in work stations and personal computers become more sophisticated, however, higher speed and more functions are continually being sought for digital circuits in the interface control sections that determine the processing speed not only in the MPU but also in computers, paths and video ports, etc. Abstract One effective approach to resolve such problems is a multifunction element. More specifically, this means using one logic element to comprise one gate to achieve a drastic reduction in the number of elements required for a digital circuit such as an MPU. Giving elements more functions not only gives the individual device higher performance but also improves overall performance of the computer by means of its circuits and MPU, etc. One attempt at such a multifunction device is the resonant tunneling device which utilizes the quantum effect.

However, devices utilizing this quantum effect (resonant tunneling phenomenon) must operate at the temperature where the thermal energy of electrons is sufficiently lower than the separation between the quantum energy levels. This requires a low temperature environment utilizing cooling methods such as liquid helium or liquid nitrogen which are troublesome to provide. In contrast, there are methods usable at room temperature such as real space transition, e.g., see "Applied Physics Letters, Vol. 35, p. 469, 1979" and band-to-band tunneling typified by devices such as CHINT (charge injection transistor) described in "Applied Physics Letters, Vol. 57, No. 17, p. 1787, 1990" and RSTLT (real space transition logic transistor) described in "IEEE trans. on E.D. Vol. 39, No. 10, P. 2189, 1992" and ME-HBT (multi emitter heterojunction bipolar transistor) "Electronics Letters, Vol. 30, No. 5, P. 459, 1994" etc.

FIG. 4 shows the operating principle of a semiconductor device utilizing real space transition. The basic structure is comprised of a channel 10 made from intrinsic GaAs, a barrier layer 30 made from intrinsic AlGaAs, a collector layer 20 made from highly N-doped GaAs, a source electrode 510, a drain (heater) electrode 520, a contact layer 501 made from highly N-doped GaAs, an electron provider layer 502 made from highly N-doped AlGaAs, and a collector electrode 530.

During the element operation, the Vcc (supply voltage) applies a positive bias to the collector electrode 530. The element potential profile is shown in FIG. 5. Due to differences in electron affinity between layers and the applied voltage, the effective thickness of the barrier 30 separating the channel layer 10 and the collector layer 20 becomes thinner at the high electron energy, and the tunneling probability increases exponentially versus the electron energy in the channel.

A difference of potential then occurs between the source electrode 510 and the drain electrode 520 which constitute the control electrodes, and the resultant electrical field causes electrons to rush from the source electrode 510 towards the drain electrode 520 in the channel layer 10. The longer the channel length, the more the electrons are scattered by impurities and phonons, and the massed energy of the electrons is converted to heat energy in response to the random movement of individual electrons. The energy level of these accelerated electrons is high, causing a transition to the L valleys and X valleys, which has high density of states. Consequently, the energy distribution center shifts to the high energy side, and the high energy electrons have a small (extremely fast) tunnelling time across the barrier 30 to the collector layer 20 (tunneling). This movement of electrons from the channel layer 10 to the collector layer 20 is called real space transition (RST). The channels at which the tunneling occurs during normal operating voltage is referred to as "tunneling channel" hereafter.

This element is configured with a switching mechanism that turns on and off by means of the collector current according to whether a difference in voltage potential is present between the source electrode 510 and the drain electrode 520 which constitute the control electrodes. The switching time is determined by the reverse figure for tunneling rate for electrons to transit the barrier 30. This is generally shorter than the delay time in the conventional device. This allows high speed operation, and research into potential applications as a high frequency device has been performed.

Research has also been performed into functional devices utilizing RST. The RST device is provided with essentially an XOR logic gate function since it operates by means of a difference in potential rather than the electrical potential within the channel. To make use of this feature, in just one technique for instance, NOR gates or NAND gates can be attained to make applications in memory and logic gates possible. The above mentioned CHINT, RSTLT and ME-HBT elements incorporate three control terminals indicating use principally for NOR and AND logic operations.

In the conventional art, the NOR gate as a basic logic gate forms one logic element. A logic circuit could be formed by a combination of NOR gates, however, if the desired logic circuit could be formed from one logic element. In such a case, then a conventional logic circuit comprised of a combination of two to six logic gates could instead be comprised by one logic element so that a reduction of 20 to 50 percent in the number of required logic elements could be achieved. In other words, not only can a reduction in the number of logic gates be achieved (replacing approximately 20 passive and active components with one logic element) but this reduction in logic elements comprising the logic circuits will provide a proportional improvement in circuit integration and power consumption. A logic element capable of a plurality of logic operation is referred to as a "multi-function logic element" hereafter.

Utilizing these multi-function logic elements means that the element nodes required in circuit design technology can be reduced so that the turnaround time for processor circuit design for instance can be reduced by up to a third or a half of the currently required time, and a great contribution can be made in development and in performance to processors and computers utilizing such logic gates and digital circuits. However, the one logic operation per one element in the conventional art can only identify differences in electrical potential between the top electrodes (i.e., the source electrode 510 and the drain electrode 520) which are both the same, making expansion of its logic functions difficult. So a simple method for increasing the internal states of the logic element is necessary to achieve the subsequent object of the invention.

SUMMARY OF THE INVENTION

In view of the above, it is therefore an object of this invention to provide a semiconductor logic element (multi-function semiconductor logic elements) having a plurality of logic functions.

It is another object of the invention to provide an apparatus utilizing these multi-function semiconductor logic elements.

To achieve the above mentioned objective, a semiconductor logic element has a semiconductor substrate with one output electrode for issuing a high or low level voltage when a high or low level voltage is applied respectively to at least the first, second and third control electrodes wherein, the output electrode outputs a voltage having an electrical potential based on a plurality of logic operations from application of voltage to the respective control electrodes.

To also achieve the above mentioned objective of the invention, a semiconductor logic element has a semiconductor layer with one output electrode for issuing a high or low level voltage when a high or low level voltage is applied respectively to at least the first, second and third control electrodes and characterized in that, a first channel has carriers in the semiconductor layer between the first control electrode and second control electrode that move towards the output electrode, and a second channel has carriers in the semiconductor layer between the first control electrode and the third control electrode that do not move towards the output electrode, and the output electrode outputs a voltage based on a plurality of logic operations due to application of voltage to the respective control electrodes.

To still further achieve the object of the invention, the semiconductor element has a collector layer 2 having a first bandgap, and a barrier layer 3 made from a second semiconductor having a second band gap wider than the first band gap formed on the collector layer 2, and a channel layer 1 made from the third semiconductor having a third band gap narrower than the second band gap formed on the barrier layer 3, and a carrier supply layer 502 to supply carriers to the channel layer 1 made from a fourth semiconductor having a fourth band gap wider than the third band gap formed on the channel layer 1. The semiconductor element also has at least the first, second and third control electrodes 51, 53 and 52 electrically connecting to the channel layer 1 and having an output electrode 500 electrically connected to the collector layer 2. It is further provided with a first channel 13 (tunneling channel) so that carriers moving between the first and second control electrodes will make a real space transition across the barrier layer 3 and move to the collector layer 2, and is further provided with a second channel 11 (hereafter, non-tunneling channel) so that carriers moving between the first and third control electrodes will not make a real space transition across the barrier layer 3 (as shown in FIGS. 1 and 2). Alternatively, the non-tunneling channel 11 can have an electronegativity larger than the electronegativity of the tunnel channel 12.

The channel 12 between the third control electrode 52 and the second control electrode 53 may be used either as a tunneling channel or as a non-tunneling channel.

To still further achieve the above object of the invention, an apparatus such as an MPU or electronic computer may utilize the semiconductor logic element.

The semiconductor multi-function logic element of this invention will be explained while referring to the example of a semiconductor logic element as shown in FIG. 1 and FIG. 2. The reference numeral 1 in FIG. 1 denotes here the channel of intrinsic GaAs in the semiconductor layer, a collector layer 2 is made from a first semiconductor piece having a first band gap, a barrier layer 3 is made from intrinsic AlGaAs, reference numeral 500 denotes the collector electrode, 501 is a contact layer, and 502 a carrier supply layer (here an electron supply layer).

The tunneling from semiconductor layer 1 composing the channel to the collector layer 2, is brought about because electrons accelerated by the electrical field are made to transition to a high energy level and large state density by a scattering mechanism. One effective method to suppress this electron scatter is the ballistic transport method which is not vulnerable to the effects from electron scatter. Choosing an appropriate channel potential profile and band structure for a channel means the length of that channel will determine whether it is ballistic or not. Accordingly, one example of the most simple structure for satisfying the conditions of this invention is shown in FIG. 2. Here the relation between each channel length is given by:

$R_{12} < R_b < R_{23}$, $R_{31}$ ($R_b$: ballistic transport distance) Here, $R_{12}$ indicates the channel length between the control electrode 51 and the control electrode 52, $R_{23}$ indicates the channel length between the control electrode 52 and the control electrode 53, $R_{31}$ indicates the channel length between the control electrode 53 and the control electrode 51. $R_b$ is dependent upon factors such as the material constants of the semiconductor layer 1 forming the channel and the channel length, the collector layer 2 and the barrier layer 3. When a GaAs compound semiconductor is utilized in each layer 1, 2 and 3, this $R_b$ will be in a range from 20 to 500 nm.

When the ballistic effect is applied in this way, the carriers can move within the channel completely or almost completely unaffected by the tunneling to the collector layer 2.

The lowest energy level of the conduction band of barrier 3 will be higher than the semiconductor layer 1 forming the channel or the highest energy level of the valence band of barrier 3 will be low or will possess both of these features. Further, when the concentration of impurities in the semiconductor layer 1 is lower than in the collector layer 2, the height of the barrier 3 will appear low as seen from the semiconductor layer 1. In addition, since electron mobility in the barrier layer 3 is high, switching operations can easily be performed even if the difference in voltage levels applied to the control electrodes is low compared to when the barrier 3 is made from the insulation layer. If mixed crystals such as AlGaAs or InGaAs are utilized as the barrier layer 3 in the semiconductor layer, then the barrier height of the barrier layer 3 can be changed as seen from the (channel) semiconductor layer 1 due to the change in the atomic composition. Therefore, by specifying the composition of this structure, the threshold voltage of the multi-function semiconductor logic element can be controlled, thus allowing a reduction in operating voltages and current consumption.

The tunneling from channel 11 to the collector layer 2 can be suppressed by establishing the barrier layer between them in sections where the tunneling rate is low (for instance in sections between the channel 11 and collector layer 2 having a high negative potential). This would allow making the distance between control terminals equal so that difficult and sophisticated methods (i.e. electron beam lithography) would no longer be needed and more inexpensive processes such as photolithography could be employed.

The carrier scattering rate changes due to the semiconductor material and impurity concentration which means the ballistic transport distance which also depends on these factors can be changed by altering the semiconductor material and impurity concentration in the channel 11 along with that of other channels. The ballistic transport distance becomes longer as the impurity concentration is lowered. This means that the position of the non-tunneling channel can be changed without having to refabricate the pattern mask, thus giving greater freedom in circuit design and manufacturing techniques. Further, changing the material of the channel 1 allows control of voltage dependence on tunneling from the channel 1 to the collector 2 so that desired device switching characteristics can be obtained.

When the element of this invention is comprised of InGaAs crystal impurities, the amount of In constituents will be large so that the band gap of the barrier 3 will be larger than the channel layer 1 and the collector layer 2. When InGaAs is utilized as the semiconductor material, high speed operation can be obtained due to the high electron mobility possessed by the material characteristics. When Si crystal and SiGe crystal impurities are utilized as the materials for constructing the logic element of this invention, an IC can be obtained with simple and inexpensive technology. When AlGaAs crystal impurities are utilized, a higher speed element can be obtained than when Si impurities are used. Also element fabrication using AlGaAs is more inexpensive than when InGaAs crystal impurities are used.

In the fabrication shown in the FIGS. 1 and 2, it was found that when the same voltage are applied to each electrode so that the same type of carriers (electrons or holes) from the third electrode 52 through non-tunneling channel 11 to the first electrode terminal 51, and through the tunneling channel 12 to the second control electrode 53, there was no tunneling of carriers to the collector layer 2 by way of the barrier 3, even if carriers were flowing to the tunneling channel 13.

Further, it was found that when the same voltage is applied to each electrode by so that the some type of carriers (electrons or holes) from the first electrode 51 through non-tunneling channel 11 to the third electrode terminal 52, and through the tunneling channel 13 to the second control electrode 53, there was no tunneling of carriers to the collector layer 2 by way of the barrier 3, even if carriers were flowing to the tunneling channel 13.

In other words, it was discovered that carrier tunneling did not occur. This was true even in tunneling channels, under conditions where carriers flowed simultaneously from electrodes connected to collector layer 2 through tunneling channels where carrier tunneling normally occurred, and also true in electrodes connected to collector layer 2 through non-tunneling channels where carrier tunneling normally did not occur.

The reason for this phenomenon was not due to the direction of current flow but rather depended on the direction of carrier flow. Therefore, for electrons this would be a direction opposite the current flow.

Obviously, carrier tunneling will occur in the electron flow to the collector layer 2 when carriers flow only from the control electrode along the tunneling channel.

Hereafter, the case when the two types of voltage potential (high and low) are respectively applied to the first, second and third control terminals will be described. Here, carriers are described as electrons but need not be limited to electrons and may be positive holes.

When the above mentioned three control electrodes all have been applied with same voltage, there is no current flow in any of the channels so that electron tunneling movement to the collector layer 2 does not occur and the voltage potential at the collector electrode 500 is high.

When one of the control electrodes, for instance the first control electrode 51 is low (voltage potential) and the other control electrodes are high, the electrons from the first control electrode 51 flow simultaneously to the non-tunneling channel 11 and the tunneling channel 13. Just as mentioned previously, the electrons move in the tunneling channel 13, no tunneling occurs in the barrier layer 3 and the output from the collector electrode 500 sets to high.

On the other hand, when the first control electrode 51 and the second control electrode 53 are low and the third control electrode 52 is high, the electrons transit the non-tunneling channel 11, moving from the first control electrode 51 to the third control electrode 52 and also transit the tunneling channel 12 flowing to the third control electrode 52 from the second control electrode 53. At that time, tunneling to the collector layer 2 of electrons flowing in the tunneling channel 12 occurs so the output of the collector electrode 500 consequently sets to low.

Also, when the first control electrode 51 and the third control electrode 52 are low, and the second control electrode 53 is high, electrons simultaneously flow in the tunneling channels 12 and 13. Since electron flow all goes to the collector layer 2, the output of the collector electrode 500 sets to low.

Further, when the second control electrode 53 and the third control electrode 52 are low, and the first control electrode 51 is high, the electrons transit the non-tunneling channel 11, moving from the third control electrode 52 to the first control electrode 51 and also transit the tunneling channel 13 flowing from the third control electrode 52 to the first control electrode 51. Since tunneling to the collector layer 2 occurs from electrons flowing in the tunneling channel 13, the output of the collector electrode 500 sets to low.

The truth table in FIG. 3 shows the voltage at the collector electrode 500 versus each of the control electrodes. The respective NOR and OR gate operations can be understood by observing the low or high voltage at the second control electrode 53 versus the inputs from the first control electrode 51 and the third control electrode 52. In the conventional art, identifying the internal status of these two gates is impossible.

FIGS. 6 and 7 show a multi-function logic element capable of a logic change during processing and having five types of logic functions including NOR and NAND gate functions. This multi-function logic element has four control electrodes 51, 52, 53 and 54 as well as one anti-tunneling channel 11 and four tunneling channels 12, 13, 14 and 15 connecting (directly or indirectly) to the semiconductor layer 501 of the semiconductor substrate 1. The output from the collector electrode 500 in response to the respective inputs from the control electrodes is shown in FIG. 8 through FIG. 11. As can be seen from these figures, switching of the NOR/OR/AND/EXNOR/NOT logic operations can be accomplished just by changing the voltage on the electrodes or the wiring without having to alter the structure of the element. This reduces the complicated circuit design process required for device substrates and contact configuration needed for obtaining the required IC operation and allows using standardized substrates when fabricating processor IC packages.

FIGS. 12 and 13 show a multi-function logic element in which the collector layer 2 is formed on the same side as the control electrodes. Tunneling from the semiconductor substrate 1 to the collector layer 2 does not pass above or below the semiconductor substrate 1 or the collector 2 so a similar operation can be seen in this structure. In this structure, however, there is no need for the contact to the collector layer 2 to pass below the substrate so separation of adjoining multi-function logic elements is easily accomplished and the structure also is ideal for circuit integration. When the collector 2 is located on the upper side, the specified planar structure can easily be fabricated as needed. For instance, mounting of the collector layer 2 can be avoided in regions where tunneling must be suppressed, thus meeting the condition of this invention that carriers be able to move regardless of carrier movement to the collector layer 2. In this structure, the reference numeral 50 denotes the substrate (for instance semi-insulating GaAs substrate).

One multi-function logic element of this invention may possess NOR/OR/AND/EXNOR/NOT functions so that, for instance, an ECL circuit utilizing this multi-function logic element may have only ⅕th to 1/20th (for 8–10 active components and 10–15 passive components) the number of elements of the conventional art, making production inexpensive. Reducing the number of elements in this kind of circuit also means reductions in current consumption, cell surface area and shorter delay times in cell internal wiring.

In the same way, integrated circuits using these multi-function logic elements allow a reduction in surface area usually required by the logic gates within one/tenth that of conventional logic gates so that higher circuit integration per area can be achieved. The smaller number of logic gates comprising the device also means that design of the IC, wiring and layout is much easier to perform. This is an essential factor especially in processor ICs where the wiring and circuit layout tends to lack uniformity. Further, when the channel forming the semiconductor substrate 1 is a P type conductivity channel, the structure formed from the logic gates can be made to have a complimentary output without excess use of NOT gates, the number of logic gates can be reduced and a simpler circuit configuration obtained. As one example, FIG. 23A shows a circuit having a NAND function utilizing only N type conductivity channel multi-function logic elements on the semiconductor substrate 1 while FIG. 23B shows a circuit having a NAND function utilizing only P type conductivity channel multi-function logic elements on the semiconductor substrate 1. It can be seen that the semiconductor substrate 1 utilizing P type conductivity channels has fewer circuit elements.

The semiconductor logic element of this invention is also basically a high frequency component, meaning it can switch at very high rates. Circuits utilizing this feature can therefore reduce their total wiring to less than one-tenth of the conventional art to allow a shorter delay time and high speed operation. Computers incorporating the logic element of this invention will therefore have faster processing times.

The description up until now has treated the carriers as electrons. However, positive holes may also be used by matching the polarities for voltage levels and charges.

The carrier movement to the collector layer 2 may be performed by the difference in voltage potential within the semiconductor layer 1 that forms the channel and need not be limited to real space transition (tunneling).

The semiconductor logic element of this invention can be given a plurality of functions. More specifically, one logic element can be provided with a plurality of logic functions.

Consequently, in the method proposed in this invention, the number of elements required in processor ICs can be reduced, total wire length which is often a bottleneck in processor development technology considerably shortened, circuit design simplified, and high speed processors obtained. The semiconductor logic elements used in these processors may also be RST elements which are high speed elements which further increase processor operating speed.

Utilizing the multi-function semiconductor logic element of this invention allows providing one logic element with a plurality of logic functions including both NOR and OR logic functions. Further, both NOR and AND logic function can be achieved in one semiconductor logic element.

BRIEF DESCRIPTION OF THE DRAWINGS

FIG. 3 is a truth table illustrating the operation of the semiconductor logic element shown in FIG. 1 and FIG. 2.

FIGS. 8, 9, 10 and 11 are all truth tables showing the logic operation of the semiconductor logic elements in FIG. 6 and FIG. 7.

DETAILED DESCRIPTION OF THE PREFERRED EMBODIMENTS

Figure 1:
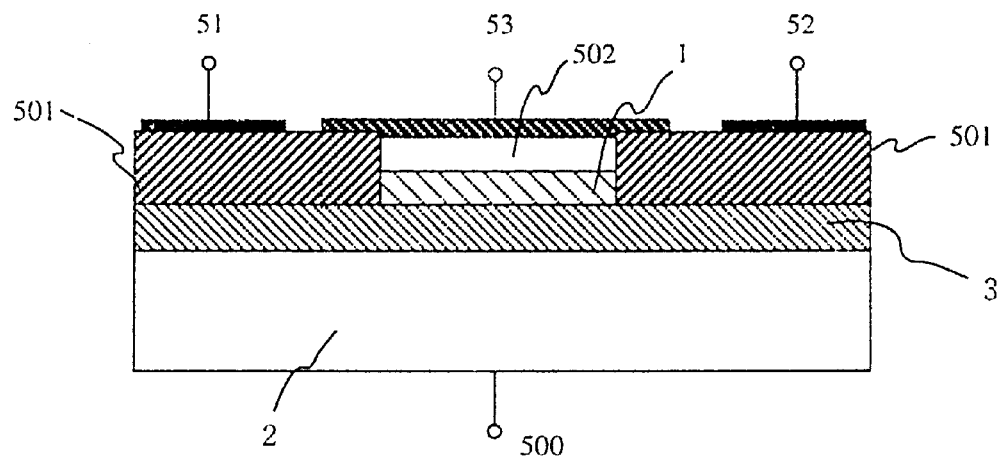
FIG. 1 is a cross sectional view of the semiconductor logic element of this invention.
Figure 2:
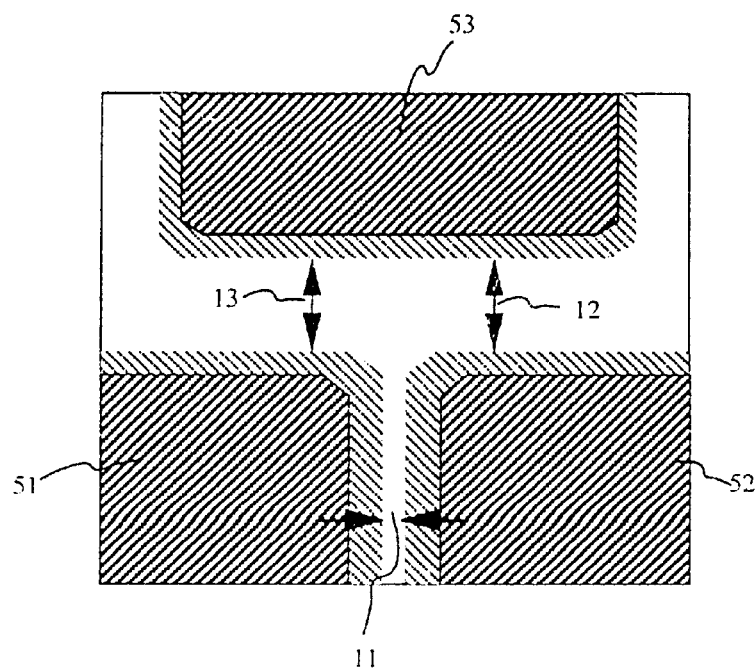
FIG. 2 is a plan view of the semiconductor logic element of this invention.
Figure 4:
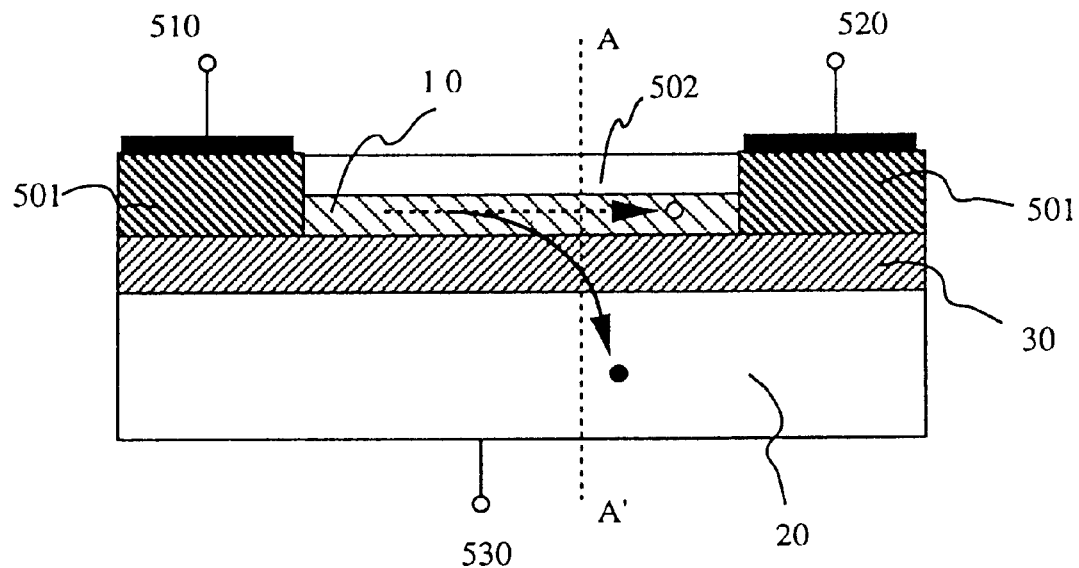
FIG. 4 is a cross sectional view of the real space transition element of the conventional art.
Figure 5:
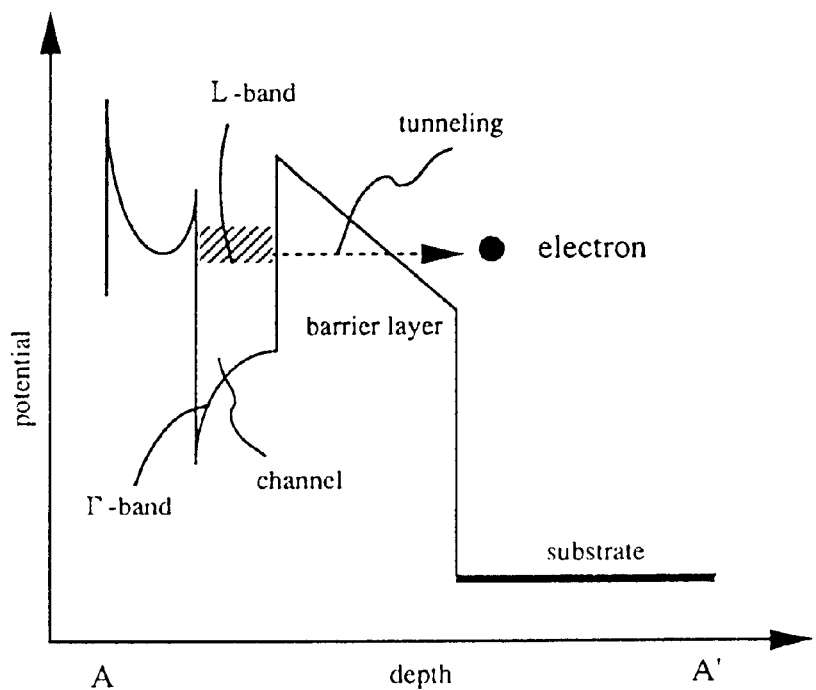
FIG. 5 is graph showing voltage potential along the line A–A' of a cross section of the real space transition element of the conventional art shown in FIG. 4.
Figure 6:
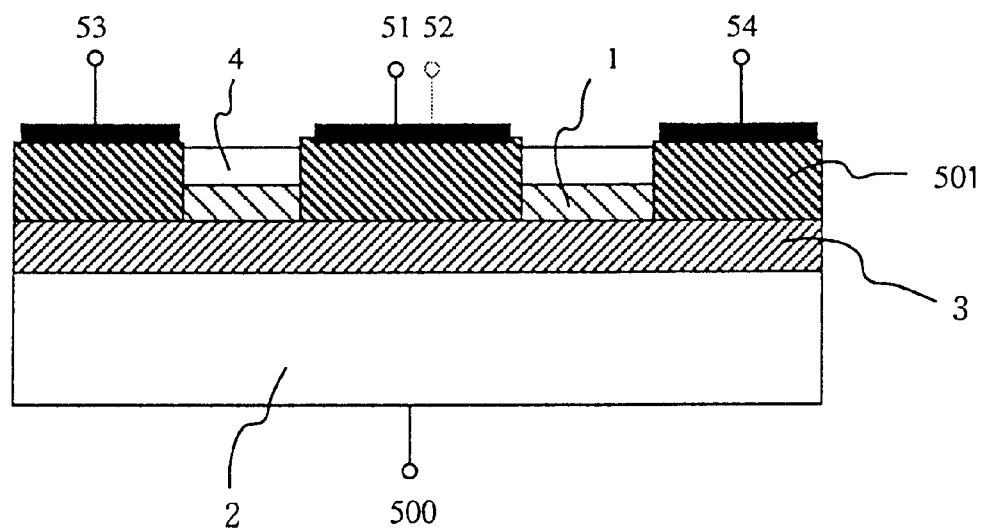
FIG. 6 is a cross sectional view of another semiconductor logic element of this invention.
Figure 7:
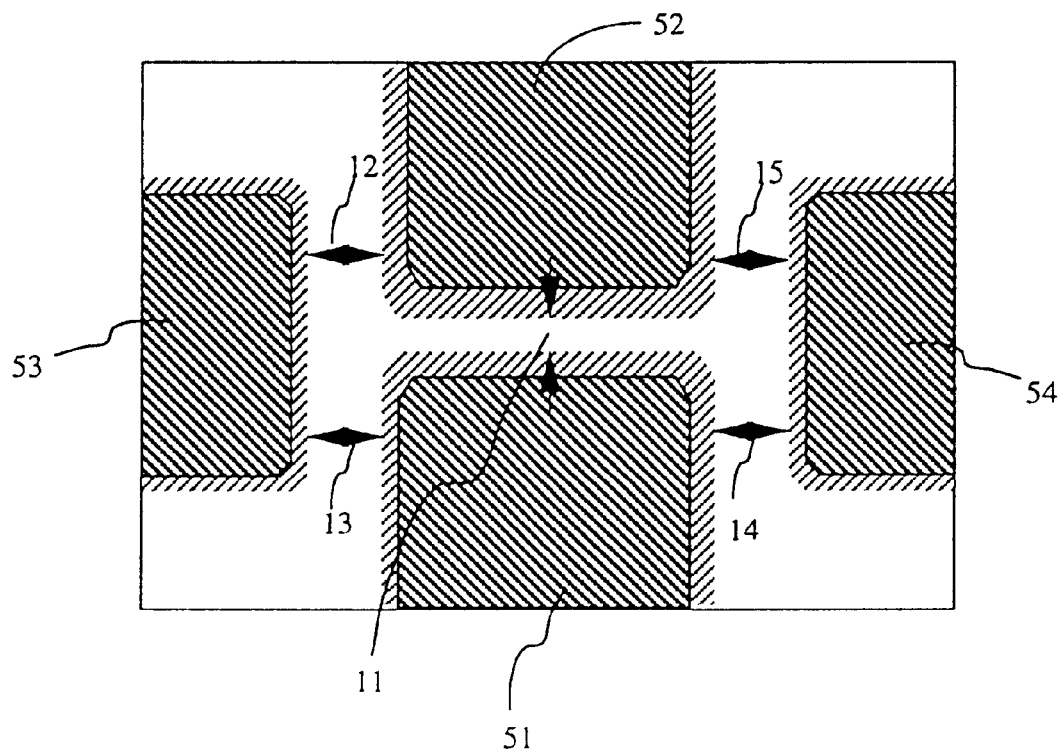
FIG. 7 is a plan view of the semiconductor logic element of this invention shown in FIG. 6.
Figure 12:
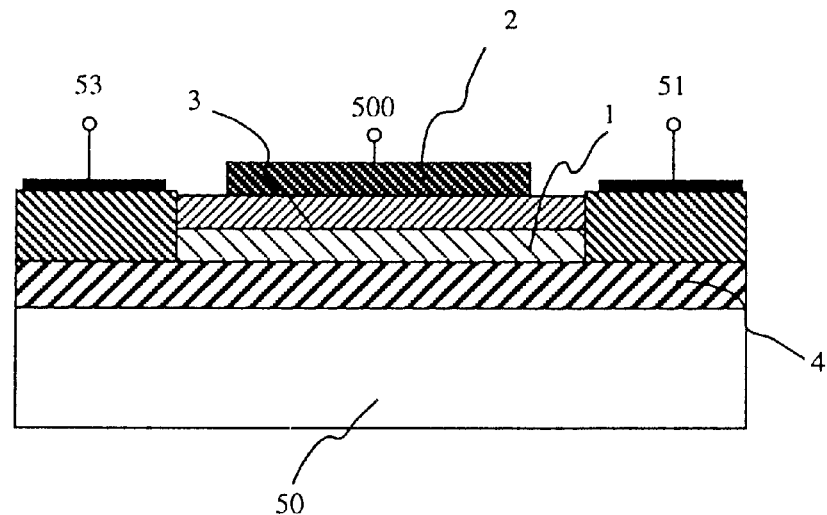
FIG. 12 is a cross sectional view and FIG. 13 a plan view of another semiconductor logic element of this invention.
Figure 13:
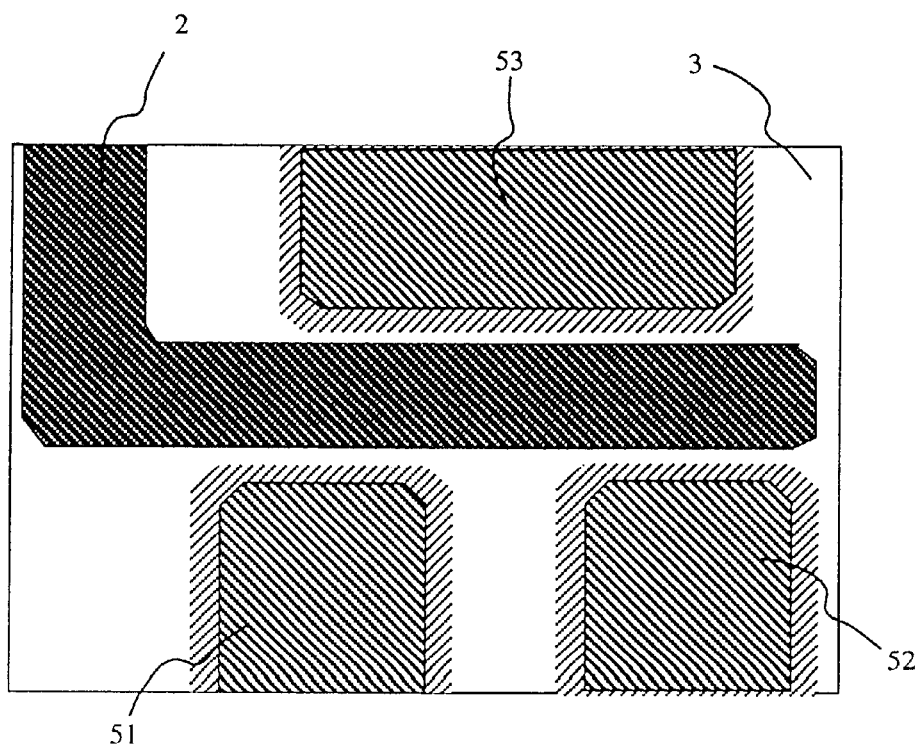

An embodiment of this invention utilizing the multi-function semiconductor logic elements of FIG. 6 and FIG. 7 is described next. The multi-function semiconductor logic element has the four control electrodes 51, 52, 53 and 54. A ballistic channel 11 is present between the control electrodes 51 and 52. The semiconductor mixed crystals were respectively formed of intrinsic GaAs for the channel comprising the semiconductor substrate 1, $1 \times 10^{19}/cm^3$ GaAs for n-type impurities in the collector layer 2, and $Al_xGa_{1-x}As$ (X=0.3) for the barrier 3. The N-type impurities of $1 \times 10^{18}/cm^3$ of AlGaAs layer 4 were applied to the channel as an electron-supply layer. The collector electrode 500 was biased to a positive voltage potential and the variable load of the collector current converted by the voltage. The potential profile of the non-ballistic channel zone for this structure is shown in FIG. 5. The channel length was set as 50 nm between the control electrode 51 and the control electrode 52, while the channel length between the control electrode 51 (or 52) and the control electrode 53 (or 54) was set as 500 nm. The fabrication method for the multi-function semiconductor logic element is described next.

The barrier layer 3 was formed from intrinsic $Al_{0.3}Ga_{0.7}As$ mixed crystal with a thickness of 200 nm on an N-type GaAs (impurity concentration $1 \times 10^{19}/cm^3$) substrate comprising the collector layer 2. The 50 nm thick semiconductor substrate 1 of intrinsic GaAs and the electron supply layer 4 (impurity concentration $1 \times 10^{18}/cm^3$) of N-type AlGaAs of 10 nm thickness (and barrier layer 3) were formed in order using the molecular beam epitaxial method. Next, a patterned resist layer was formed as the mask using electron beam lithography and the zone of the semiconductor substrate 1 comprising the contact layer removed. Next, a contact layer 501 is selectively formed from highly doped intrinsic N-type GaAs impurities of $1 \times 10^{19}/cm^3$ utilizing the MOCVD (metal organic chemical vapor deposition) method, and control electrodes 51, 52, 53 and 54 of a layer of Au/Mo/AuZn formed above the contact layer 501. Preferably the semiconductor substrate comprising the collector layer 2 has a thickness of a least 100 nm.

The operation of this semiconductor logic element is described next. Here the voltages applied to the control terminal are expressed by the terms "High" and "Low".

(1) In an example of positive logic OR operation in the semiconductor logic element of this invention, the control electrode 53 and the control electrode 54 are set High, and when the control electrodes 51 and 52 are set Low, the electrons in channel 12, channel 13, channel 14 and channel 15 flow from the control electrodes 51 and 52 towards the control electrodes 53 and 54. Tunneling of electrons occurs within the collector layer 2 since these channels have been set longer than the ballistic distance. Collector current accompanying this electron tunneling movement causes the voltage potential at the collector electrode 500 of the logic element to drop and this output is Low.

When the control electrode 53 and the control electrode 54 are set High and the control electrodes 51 and 52 are also set High, all control electrodes are at the same voltage potential. Electrons do not flow in the channel so the output at the collector electrode 500 sets to High.

When the control electrode 53 and the control electrode 54 are set High and the control electrode 51 is also set High with the control electrode 52 is set Low, the electrons simultaneously flow in the non-tunneling channel 11, the tunneling channel 12 and the tunneling channel 15 using the control electrode 52 as a start point. In this case, electrons tunneling towards the collector layer 2 does not occur even in the tunneling channel so the collector electrode 500 sets to High.

Even in cases where the control electrode 53 and the control electrode 54 are set High and the control electrode 51 is set Low while the control electrode 52 is set High, the voltage potential at the collector electrode 500 will be High.

Therefore as shown above, when the control electrode 53 and the control electrode 54 have been set High, the semiconductor logic element of this invention will function as a positive logic OR circuit with respect to the voltages input to the control electrode 51 and the control electrode 52 as shown in FIG. 8.

(2) In an example of positive logic NOR operation in the semiconductor logic element of this invention, when the control electrode 53 and the control electrode 54 are set Low, and the control electrodes 51 and 52 are also set Low, all control electrodes are at the same voltage potential. Electrons do not flow in the channel so the output at the collector electrode 500 sets to High.

When the control electrode 53 and the control electrode 54 are set Low and the control electrode 51 and control electrode 52 are both set High, the electrons simultaneously flow in the tunneling channel 12, the tunneling channel 13, the tunneling channel 14 and the tunneling channel 15 from the control electrodes 53 and 54 towards the control electrodes 51 and 52. In this case, electron tunneling towards the collector layer 2 occurs in these channels so the voltage potential on the collector electrode 500 sets to Low.

When the control electrode 53 and the control electrode 54 are set Low and the control electrode 51 is set High with the control electrode 52 set Low, the electron injection start point is the control electrode 52, the control electrode 53 and the control electrode 54. Accordingly, tunneling towards the collector layer 2 occurs in the electrons flowing in the tunneling channels 13 and 14 so that the output on the collector electrode 500 sets to Low.

When the control electrode 53 and the control electrode 54 are set Low and the control electrode 51 is set Low with the control electrode 52 set High, the electron injection start point is the control electrode 51, the control electrode 53 and the control electrode 54. Accordingly, tunneling towards the collector layer 2 occurs in the electrons flowing in the tunneling channels 12 and 15 so that the output on the collector electrode 500 sets to Low.

Therefore, as shown above, when the control electrode 53 and the control electrode 54 have been set Low, the semiconductor logic element of this invention will function as a positive logic NOR circuit with respect to the voltages input to the control electrode 51 and the control electrode 52 as shown in FIG. 8.

(3) In an example of positive logic AND operation in the semiconductor logic element of this invention, when the control electrode 51 and the control electrode 52 are set High and the control electrodes 53 and 54 are set Low, the electron injection start point is the control electrode 53 and the control electrode 54. Accordingly, since electrons flow in the tunneling channel 12, the tunneling channel 13, the tunneling channel 14, and the tunneling channel 15, and tunneling occurs towards the collector layer 2, so the output on the collector electrode 500 sets to Low.

When the control electrode 51 and the control electrode 52 are set High, and the control electrodes 53 and 54 are also set High, all control electrodes are at the same voltage potential. Electrons do not flow in the channel so the output at the collector electrode 500 sets to High.

When the control electrode 51 and the control electrode 52 are set High and the control electrode 53 is set High with the control electrode 54 set Low, the electron injection start point is the control electrode 54. Accordingly, electrons flow in the tunneling channel 14 and the tunneling channel 15 so that tunneling towards the collector layer 2 occurs and the output on the collector electrode 500 sets to Low.

When the control electrode 51 and the control electrode 52 are set High and the control electrode 53 is set Low with the control electrode 54 set High, the electron injection start point is the control electrode 53. Accordingly, electrons flow in the tunneling channel 12 and the tunneling channel 13 so that tunneling towards the collector layer 2 occurs and the output on the collector electrode 500 sets to Low.

Therefore, as shown above, when the control electrode 51 and the control electrode 52 have been set High, the semiconductor logic element of this invention will function as a positive logic AND circuit with respect to the voltages input to the control electrode 53 and the control electrode 54 as shown in FIG. 9.

(4) By referring to FIGS. 8 and 9, an example of EXNOR operation in the semiconductor logic element of this invention can be seen in FIG. 10, when the control electrode 52 and the control electrode 54 have been set Low with respect to the input voltage to the control electrode 51 and the control electrode 53. Further, logic NOT as well as "through" (dummy) operation is shown in FIG. 11 when the control electrode 52 is treated as the input electrode.

Thus, as was demonstrated above, the semiconductor logic element of this invention is capable of five types of logic functions and is switchable during NOR/OR and NOT/through logic processing. In the above examples electrons were assumed to be the carriers. However, the operating principle remains the same even if positive holes are the carriers. However, when positive holes are utilized, and P-type semiconductor is used as the semiconductor substrate 1 comprising the channel, then the charge sign on the carriers shifting to the collector layer 2 will reverse and the output (voltage potential) will also reverse, according to each case with the respective OR/NOR/NAND/EXOR/through/NOT operation taking place.

Figure 14:
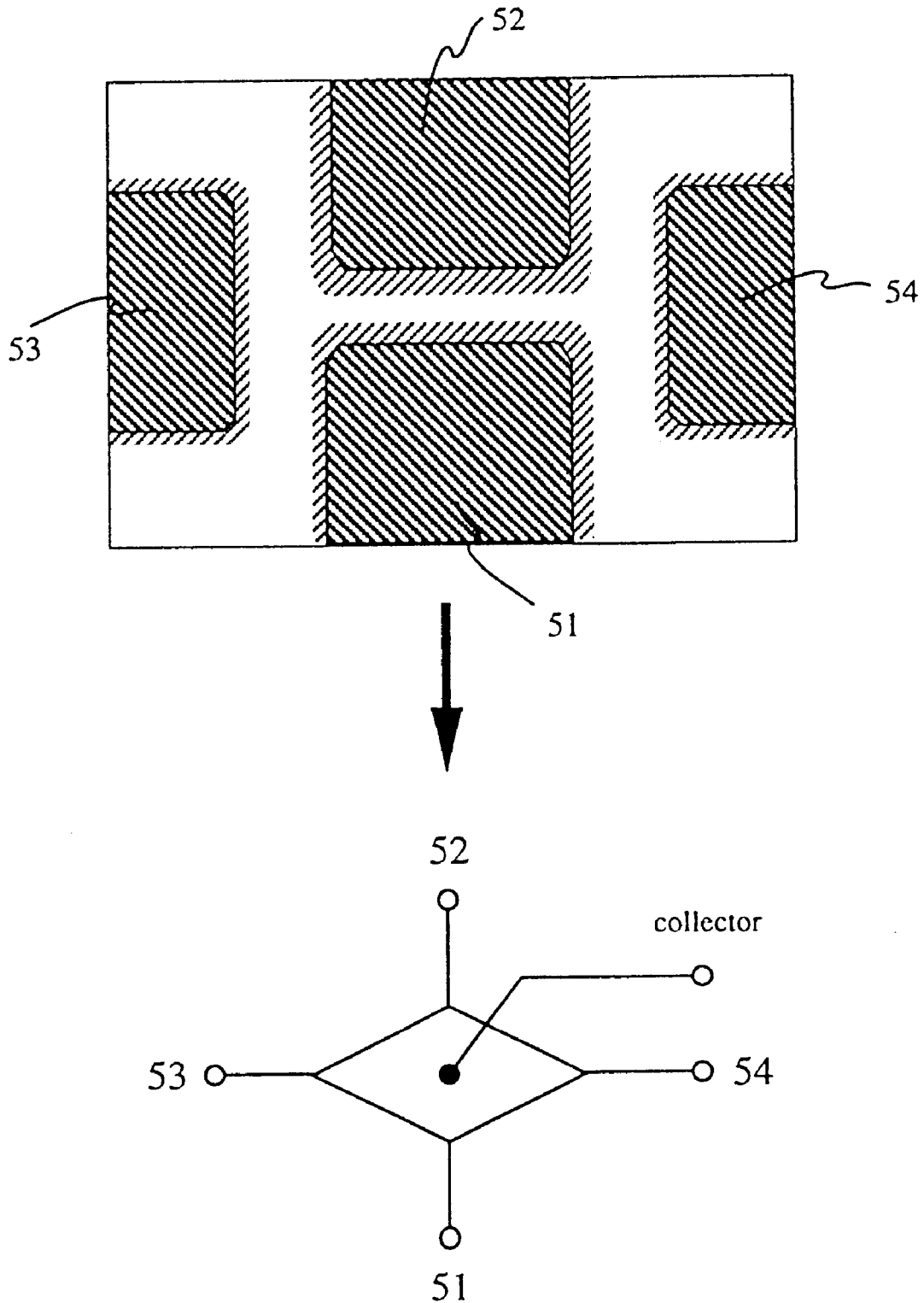
FIG. 14 is a plan view and circuit diagram of the semiconductor logic element shown in FIG. 6 and FIG. 7.

When the circuit signals of the semiconductor logic element of this invention are expressed as shown in FIG. 14, the circuit equivalents of the NOR/OR/AND/EXNOR/NOT/through logic gates can each be shown as in FIG. 15 through FIG. 18. The control terminal is shown by C in FIGS. 15 through FIG. 18 and VCC indicates the respective supply voltage terminals.

Figure 15:
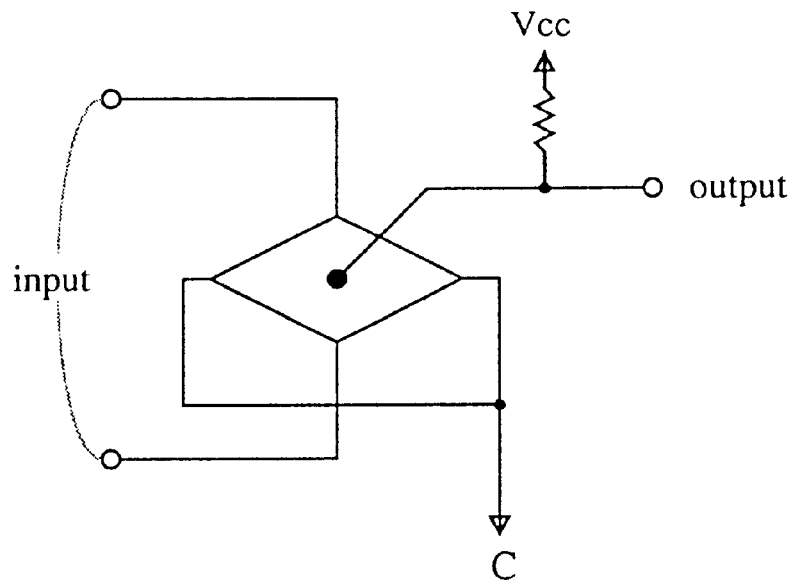
FIG. 15 is a circuit diagram of the NOR/OR logic operation performed by means of LOW or HIGH voltages at the control input C and comprised of the semiconductor logic elements of this invention.
Figure 16:
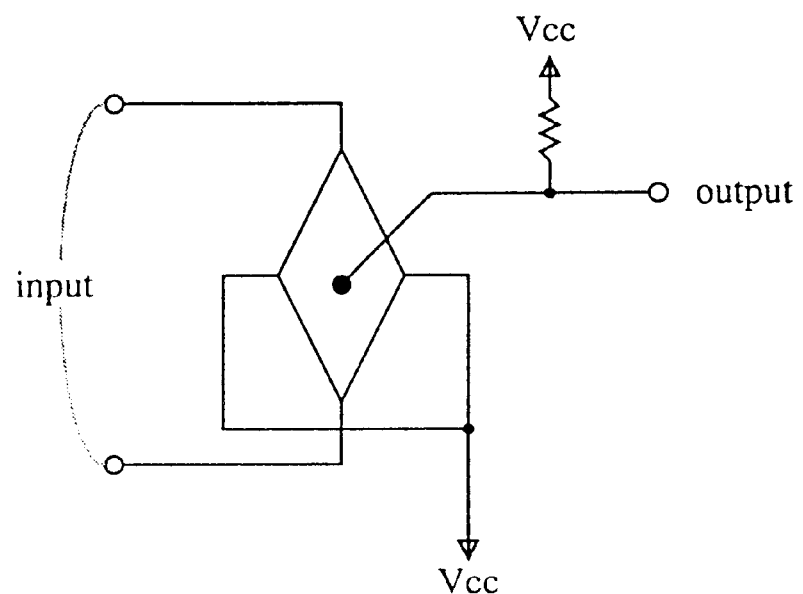
FIG. 16 is an AND logic circuit diagram of a circuit comprised of the semiconductor logic elements of this invention.
Figure 17:
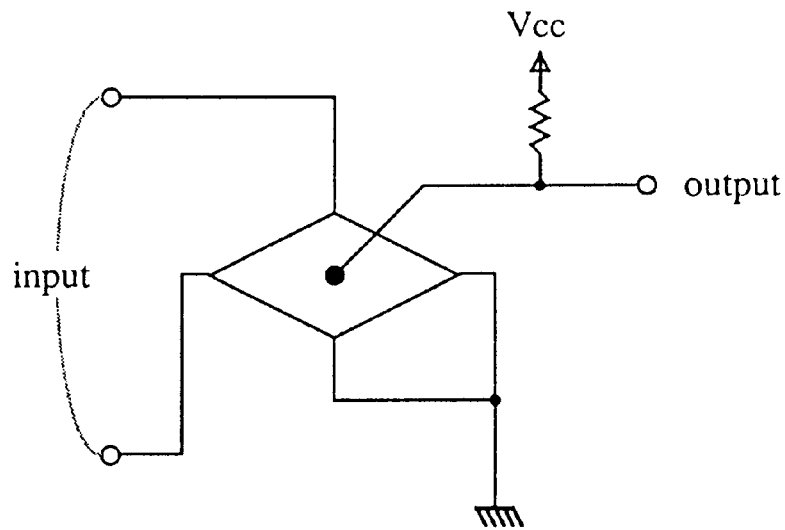
FIG. 17 is an EXNOR logic circuit diagram of a circuit comprised of the semiconductor logic elements of this invention.
Figure 18:
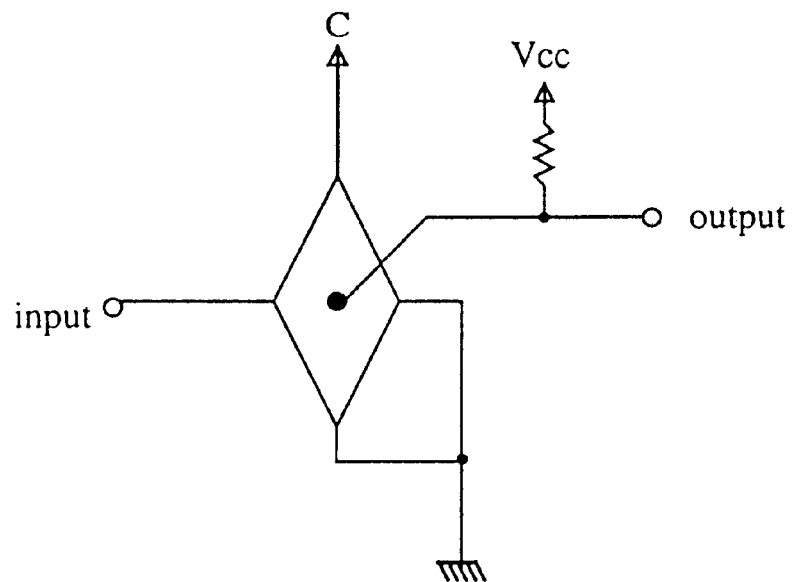
FIG. 18 is a circuit diagram of the NOT/through logic operation performed by means of LOW or HIGH voltages at the control input C and comprised of the semiconductor logic elements of this invention.

As can be seen from the truth tables in FIG. 8 through FIG. 11, the circuit of FIG. 15 will function as a NOR or OR logic gate according to the Low or High voltage potential applied to the control terminal C. the circuit of FIG. 16 will function as an AND logic gate and the circuit of FIG. 17 will function as an EXNOR logic gate. The circuit of FIG. 18 will function as a NOT or "through" logic gate according to the Low or High voltage potential applied to the control terminal C.

Figure 19:
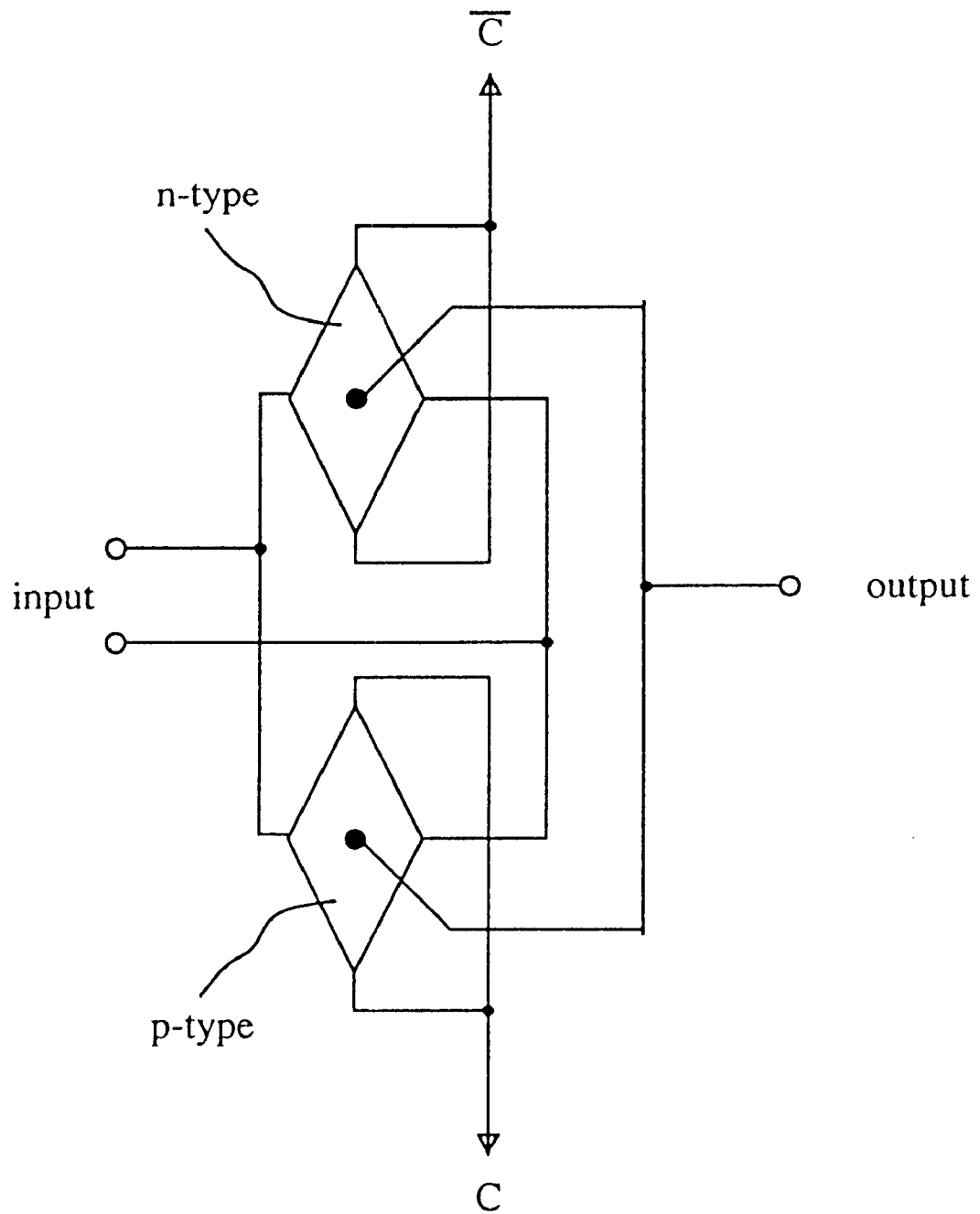
FIG. 19 is a NOR/OR logic circuit diagram of a circuit combination of semiconductor logic elements with complimentary outputs comprised of a channel pair of mutually opposite polarity.

In another embodiment of this invention, the multifunction logic element is configured in a complimentary arrangement, shown with the output load removed in FIG. 19. The output is a sink current when Low and a source current when High. This allows increasing the drive power at the output without increasing current consumption and also increasing the fanout (number of elements that the output can drive). The element shown in FIG. 19 with the semiconductor logic elements in a complementary arrangement uses mutually opposing conductivity type material (N or P) for the channel composing the semiconductor substrate 1.

Figure 20:
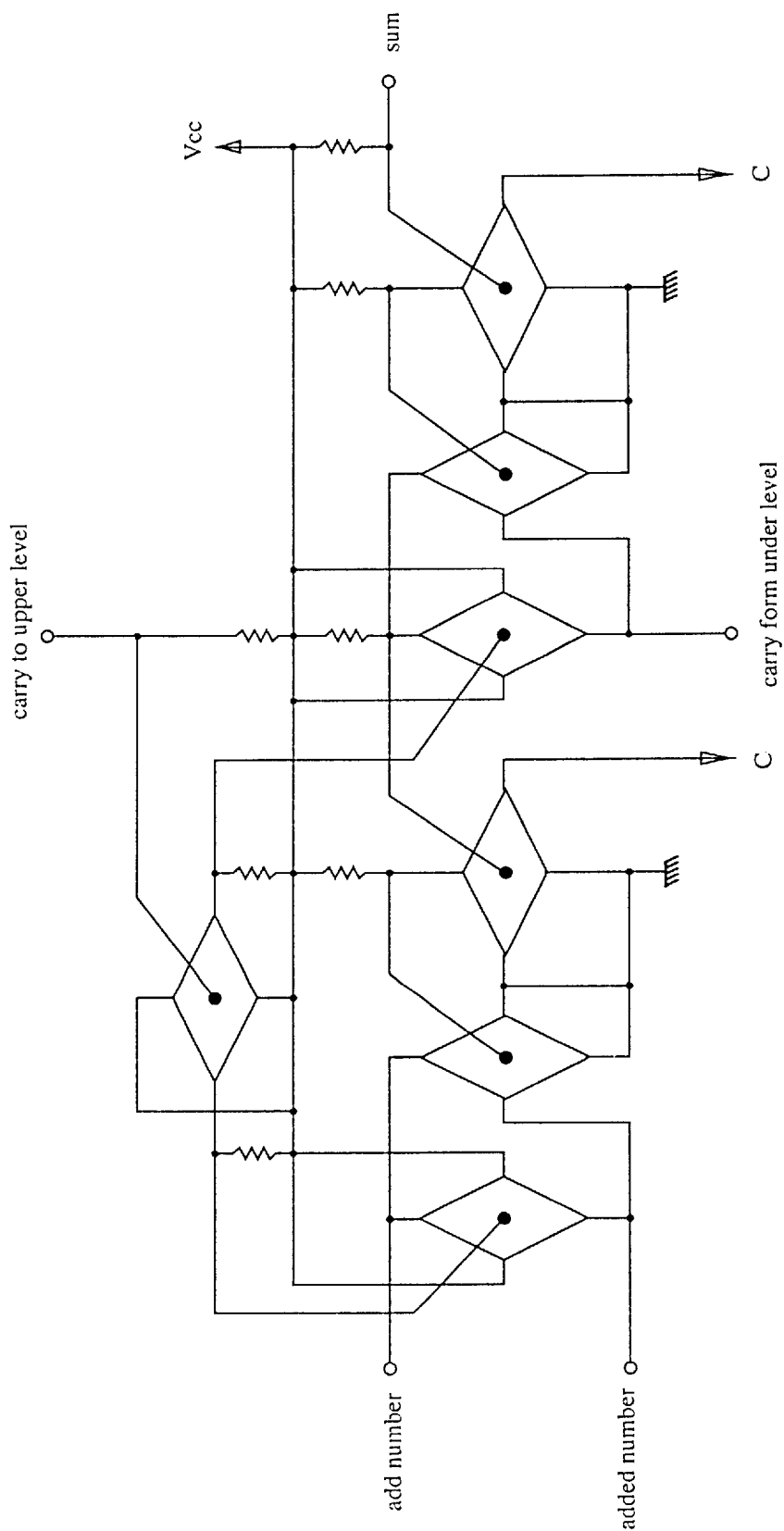
FIG. 20 is a circuit diagram of a full adder comprised of a plurality of the semiconductor logic elements of this invention.

FIG. 20 shows a full adder, which is a basic computational unit, and here uses a plurality of semiconductor logic elements. The conventional technology using ECL (emitter-coupled logic) requires 180 active and passive components but the circuit of FIG. 20 requires only 14 logic elements. The arrangement of the components also allows the overall surface area to be reduced to one-tenth that of the conventional art.

Inputs of each half-adder can be inverted by means of Low and High control signal C inputs in this circuit enabling switching between full adders and full subtracters. This means that support circuits required when using a plurality of subtracters in the conventional art, (in ECL about 80 passive and active components are needed) are now unnecessary. This improvement is made possible by the logic functions available in this invention and the fact that logic functions are switchable during processing. Building a circuit or apparatus utilizing the element of this invention means that the number of logic gates and circuits needed to perform a particular function can be reduced.

Figure 21:
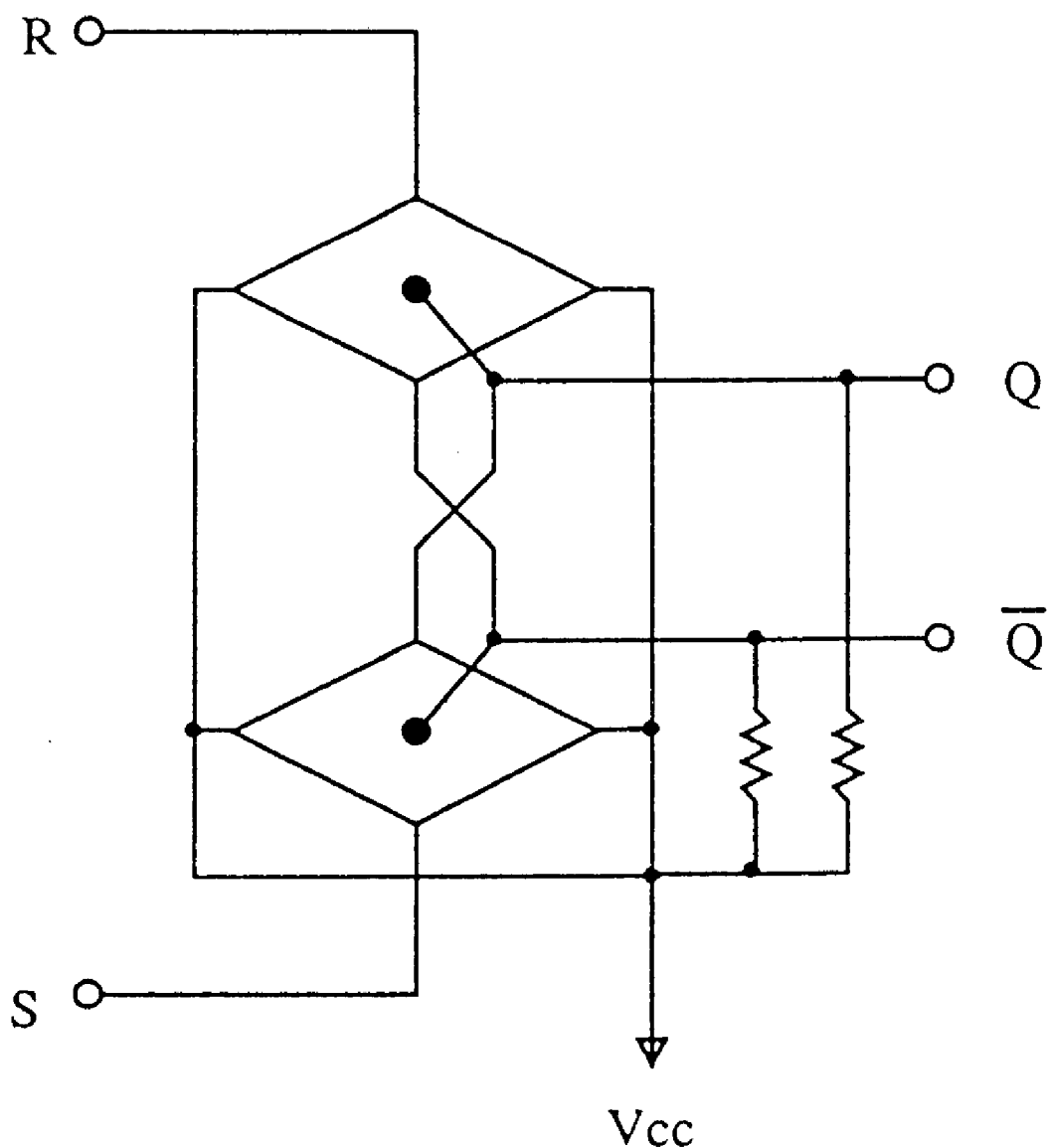
FIG. 21 is an RS flipflop circuit diagram utilizing the semiconductor logic elements of this invention.

Yet another example of an embodiment of this invention is a circuit basic to sequential logic circuits, known as a flipflop, which uses a combination of the previously mentioned logic circuits. FIG. 21 shows the most basic type of flipflop, the RS-FF (reset-set flipflop) comprised of the logic elements of this invention.

The RS flipflop has two outputs Q and $\overline{Q}$ that serve to supplement each other versus an S (set) input and an R (reset) input. When the S (set) input has been set High, the Q output is set High, and when the reset (R) input is set High, the Q output is reset to Low. When either the S (set) or R (reset) inputs are Low, the output Q maintains (or holds) the previous status. The Q output is unstable when both the S (set) and R (reset) inputs are High so this state is prohibited.

Using ECL to comprise these RS flipflops requires a total of approximately 40 active and passive components. On the other hand utilizing the semiconductor multi-function logic elements of this invention allows building the RS flipflop with only four components.

Figure 22:
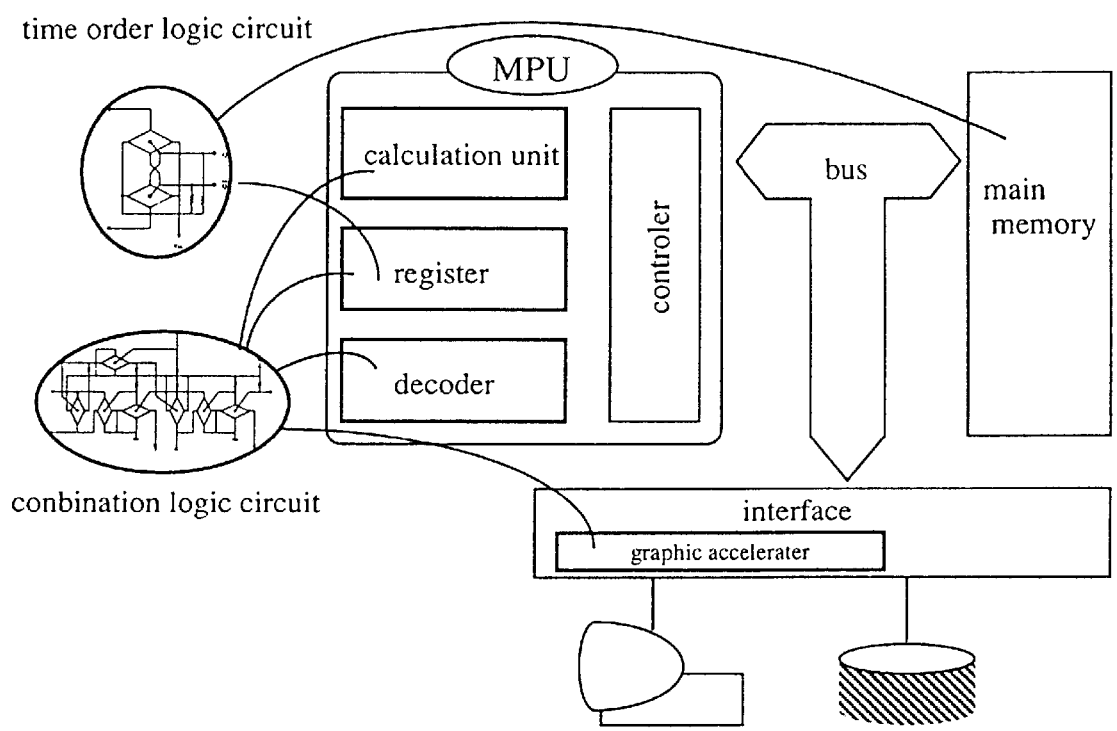
FIG. 22 is a concept view of a processor and computer utilizing the semiconductor logic elements of this invention.
Figure 23A:
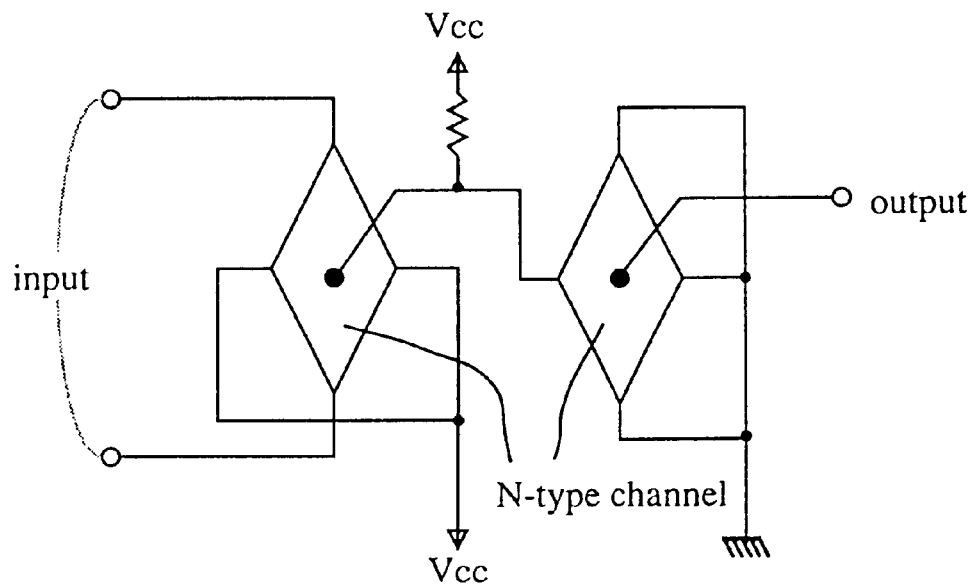
FIG. 23A is a NAND logic circuit diagram comprised of semiconductor N type conductivity channels used as the semiconductor logic element of this invention.
Figure 23B:
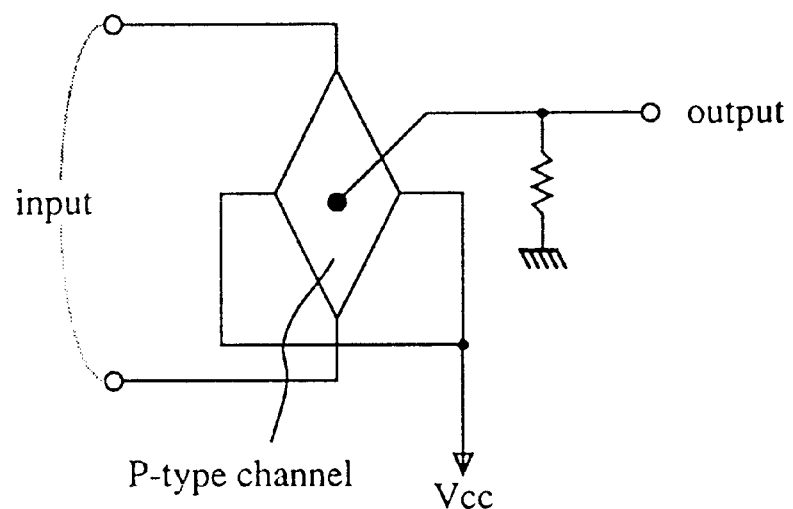
FIG. 23B is a NAND logic circuit diagram comprised of semiconductor P type conductivity channels used as the semiconductor logic element of this invention.
Figure 24:
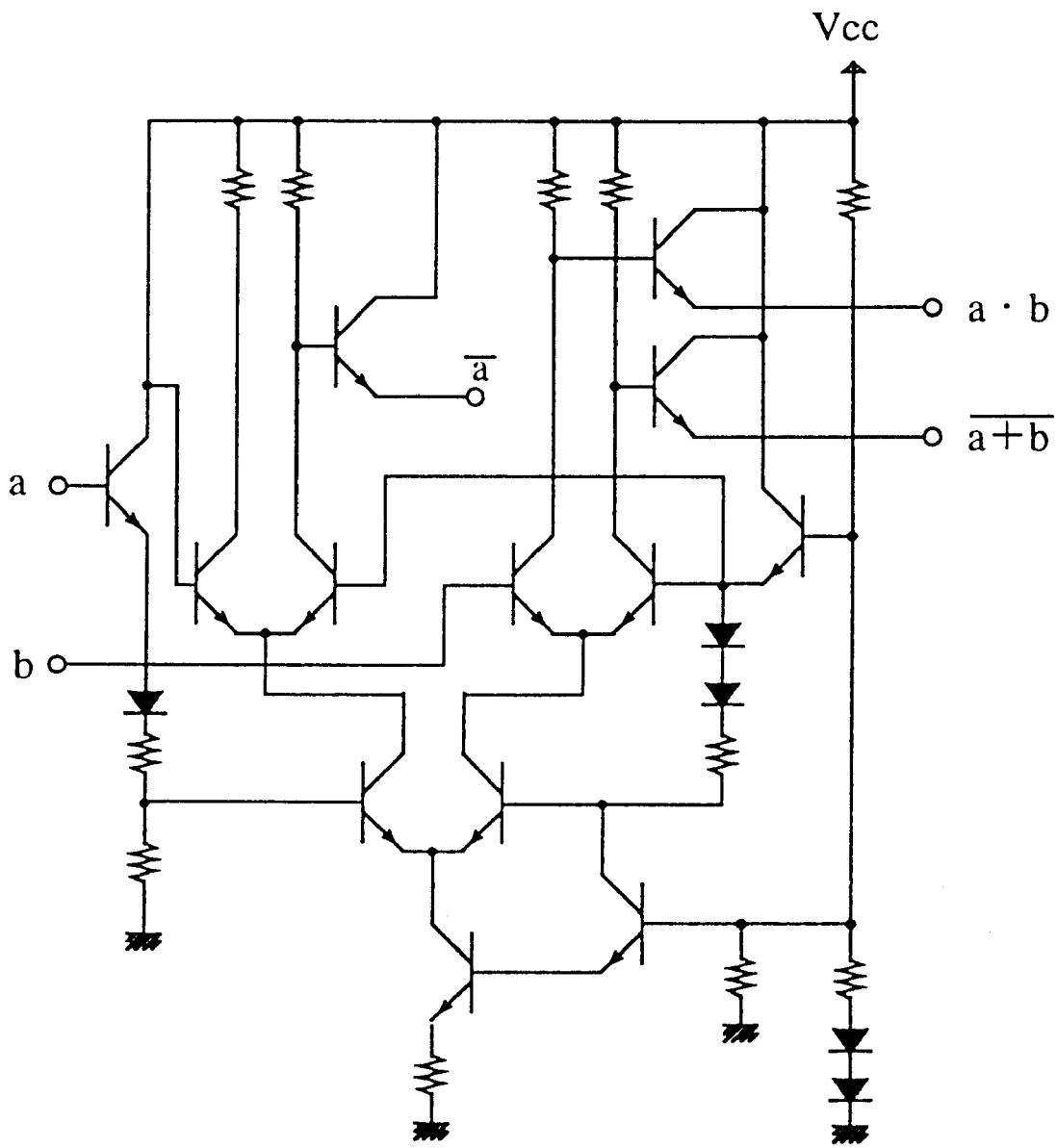
FIG. 24 is NOR logic circuit diagram of the conventional art having an ECL circuit comprised of transistors and diodes.

FIG. 22 gives an example of how the semiconductor multi-function logic elements of this invention are used with an MPU. The MPU (microprocessor unit) is comprised of components such as a processing unit, register, decoder and counter. The decoder and processing unit themselves form a combinational logic circuit. The processing unit can perform the four basic arithmetic functions, but utilizing bit shift through an adder as shown in FIG. 21 allows other operations to be performed as well. The register and counter are utilized in the flipflop which is a sequential logic circuit. An MPU can therefore be comprised of circuits using the logic elements of this invention, and just as in the previous case, the amount of components needed can be reduced to about one-tenth that of the conventional art. The switching time needed per element then becomes much shorter and to thereby enable rapid speed MPU operation. This, in combination with the simpler production process, makes elements constructed in accordance with the present invention highly advantageous.

FIG. 22 also shows an example of a computer utilizing the logic elements of this invention. High speed operation is attained by using the logic circuits and elements of this invention in each section of the computer. Among these, the control interfaces such as the graphic accelerator, along with the CPU are vital sections. As graphical user interfaces (GUI) such as utilized in work stations and personal computers become more sophisticated, however, higher speed and more functions are continually being sought for faster image processing that, in turn, is linked to the processing speed of the computer. Accordingly, using the elements and circuit of this invention not only in the MPU but also in interface control sections will promote higher operating speed and also permit a simpler internal structure in the computer.

As explained above, one of the semiconductor multi-function logic elements of this invention can perform the functions of a plurality of logic gates. This enables a drastic reduction in the number of components required in a logic circuit, reduces the overall length of wiring in the digital circuitry and simplifies circuit design. Accordingly, logic circuits comprised of the semiconductor multi-function logic elements of this invention are ideal for applications in apparatus including digital circuits such as microprocessors and computers.

What is claimed is:

1. A semiconductor logic element having a semiconductor substrate with an output electrode for issuing a high or low level voltage when a high or low level voltage is applied respectively to the first, second, third and fourth control electrodes, wherein:
    said first and third control electrodes are disposed adjacent to each other,
    said second control electrode is formed adjacent to said first and third control electrodes,
    said fourth control electrode is formed adjacent to said first and third control electrodes, and opposite the second control electrode relative to said first and third control electrodes, and
    said output electrode issues a voltage based on a first logic operation in response to a voltage applied to said first and second control electrodes, while a fixed low level voltage is applied to said second and fourth control electrodes, and said output electrode issues a voltage based on a second logic operation and differing from the first logic operation in response to a voltage applied to said first and third control electrodes, while a fixed high level voltage is applied to said second and fourth control electrodes.

2. A semiconductor logic element according to claim 1 wherein the first logic operation is a NOR logic operation and the second is an OR logic operation.

3. A semiconductor logic element having a semiconductor substrate with one output electrode for issuing a high or low level voltage when a high or low level voltage is applied respectively to first, second, third and fourth control electrodes wherein:
    said first and third control electrodes are formed adjacent to each other,
    said second control electrode is formed adjacent to said first and third control electrodes,
    said fourth control electrode is formed adjacent to said first and third control electrodes, and opposite the second control electrode relative to said first and third control electrodes, and
    said output electrode issues a voltage based on an AND logic operation in response to a voltage applied to said second and fourth control electrodes, while a fixed low level voltage is applied to said first and third control electrodes.

4. A semiconductor logic element having a semiconductor substrate with one output electrode for issuing a high or low level voltage when a high or low level voltage is applied respectively to first, second, third and fourth control electrodes, wherein:
    said first and third control electrodes are formed adjacent to each other,
    said second control electrode is formed adjacent to said first and third control electrodes,
    said fourth control electrode is formed adjacent to said first and third control electrodes, and opposite the second control electrode relative to said first and third control electrodes, and
    said output electrode issues a voltage based on an EXNOR logic operation in response to a voltage applied to said first and second control electrodes, while a fixed low level voltage is applied to said third and fourth control electrodes.

5. A semiconductor logic element having a semiconductor substrate with one output electrode for issuing a high or low level voltage when a high or low level voltage is applied respectively to at least first, second and third control electrodes electrically connected to said semiconductor substrate, wherein:
    said semiconductor logic element has a first channel located within said semiconductor substrate between said first and said second control electrodes and carriers move in said first channel towards said output electrode,
    said semiconductor logic element has a second channel located within said semiconductor substrate between said first and said third control electrodes and carriers do not move substantially in said second channel towards said output electrode, and
    said output electrode issues a voltage in response to a plurality of logic operations resulting from applications of a voltage to said first, second and third control electrodes.

6. A semiconductor logic element comprising:
    a collector layer made from a first semiconductor piece having a first band gap,
    a barrier layer formed on said collector layer, said barrier layer being made from a second semiconductor piece and having a second band gap wider than said first band gap, a channel layer formed from a third semiconductor piece on said barrier layer and having a third band gap narrower than said second band gap, a carrier supply layer formed in said channel layer for supplying carriers to said channel layer made from a fourth semiconductor having a fourth band gap wider than said third band gap, and at least first, second and third control electrodes electrically connected to said channel layer, and having one output electrode electrically connected to said collector layer, wherein:

a first channel is formed between said first and second control electrodes, and carriers moving between said control electrodes make a real space transition of said barrier and move towards said collector layer, and a second channel is formed between said first and third control electrodes, and carriers moving between said control electrodes make a real space transition of said barrier and move towards said collector layer and the quantity of carriers transiting said second channel and moving to said collector layer is smaller than the quantity of carriers transiting said first channel and moving to said collector layer.

7. A semiconductor logic element comprising:

a substrate, and a carrier supply layer formed on said substrate of a first semiconductor piece, and having a first band gap for supplying carriers to a channel layer wherein the channel layer is made from a second semiconductor piece formed on said substrate, said channel layer having a second band gap narrower than said first band gap, a barrier layer made from a third semiconductor piece formed on said substrate and having a third band gap wider than said second band gap, a collector layer made from a fourth semiconductor piece formed on said barrier layer and having a fourth band gap narrower than said third band gap, at least first, second and third control electrodes electrically connected to said channel layer, and an output electrode electrically connected to said collector layer, wherein:

a first channel is formed between said first and second control electrodes, and carriers moving between said control electrodes make a real space transition of said barrier and move towards said collector layer, and a second channel is formed between said first and third control electrodes, and carriers moving between said control electrodes make a real space transition of said barrier and move towards said collector layer, and the quantity of carriers transiting said second channel and moving to said collector layer is smaller than the quantity of carriers transiting said first channel and moving to said collector layer.

8. A semiconductor logic element comprising:

a collector layer made from a first semiconductor piece having a first band gap, a barrier layer made from a second semiconductor piece formed on said collector layer and having a second band gap wider than said first band gap, a channel layer made from a third semiconductor piece formed on said barrier layer and having a third band gap narrower than said second band gap, a carrier supply layer formed on said channel layer made from said fourth semiconductor piece, and having a fourth band gap wider than a third band gap for supplying carriers to said channel layer, having at least first, second and third control electrodes electrically connected to said channel layer, and having one output electrode electrically connected to said collector layer, a first channel formed between said first and second control electrodes, having a first channel length, and a second channel formed between said first and third control electrodes, said second channel having a channel length shorter than said first channel length.

9. A semiconductor logic element according to claim 8 wherein said first channel length is equal to or greater than the ballistic transport distance $R_b$ of the carrier within said channel layer and said second channel length is less than $R_b$.

10. A semiconductor logic element comprising:

a substrate, a carrier supply layer formed on said substrate of said first semiconductor piece, and having a first band gap for supplying carriers to a channel layers, wherein the channel layer is made from a second semiconductor piece formed on said substrate and having a second band gap narrower than said first band gap, a barrier layer made from a third semiconductor piece formed on said substrate and having a third band gap wider than said second band gap, a collector layer made from a fourth semiconductor piece formed on said barrier layer and having a fourth band gap narrower than said third band gap, at least first, second and third control electrodes electrically connected to said channel layer, and an output electrode electrically connected to said collector layer, a first channel formed between said first and second control electrodes, having a first channel length, and a second channel formed between said first and third control electrodes, said second channel having a channel length shorter than said first channel length.

11. A semiconductor logic element according to claim 10 wherein said first channel length is equal to or greater than the ballistic transport distance $R_b$ of the carrier within said channel layer and said second channel length is less than $R_b$.

12. A semiconductor logic element comprising:

a collection layer made from a first semiconductor piece having a first band gap, a barrier layer made from a second semiconductor piece formed on said collector layer and having a second band gap wider than said first band gap, a channel layer made from a third semiconductor piece formed on said barrier layer and having a third band gap narrower than said second band gap, a carrier supply layer formed on said channel layer made from a fourth semiconductor piece, and having a fourth band gap wider than a third band gap for supplying carriers to said channel layer, at least first, second and third control electrodes electrically connected to said channel layer, and having one output electrode electrically connected to said collector layer, a first channel between said first and said second control electrodes, having an impurity concentration, and a second channel of semiconductor having a lower impurity concentration than said first channel, said second channel being formed between said first and said third control electrodes.

13. A semiconductor logic element comprising:

a substrate, a carrier supply layer formed from said substrate of a first semiconductor piece, and having a first band gap for supplying carriers to a channel layer, wherein the channel layer is made from a second semiconductor piece formed on said carrier supply layer and having a second band gap narrower than said first band gap, a barrier layer made from a third semiconductor piece formed on said channel layer and having a third band gap wider than said second band gap, a collector layer made from a fourth semiconductor piece formed on said barrier layer and having a fourth band gap narrower than said third band gap, at least first, second and third control electrodes electrically connected to said channel layer, and an output electrode electrically connected to said collector layer, a first channel between said first and said second control electrodes, having a first impurity concentration, and a second channel of semiconductor having a second impurity concentration lower than said first impurity concentration, said second channel being formed between said first and said third control electrodes.

14. A microprocessor utilizing a semiconductor logic element, comprising:

a semiconductor substrate, at least first, second and third control electrodes for applying a high or a low level voltages respectively, an output electrode for output of a high or a low level voltage in response to applied voltage to said at least first, second, and third control electrodes, respectively, said output electrode outputting a voltage level along with one or more logic operations resulting from applying a voltage to said first, second and third control electrodes, respectively, a tunneling channel between one control electrode and another control electrode selected from the group of said at least first, second, and third control electrodes for applying a high or a low level voltage, respectively, a non-tunneling channel between one control electrode and another control electrode selected from the group of said at least first, second, and third control electrodes for applying a high or a low level voltage, respectively, and a controller for controlling an arithmetic unit, register and decoder also contained in said microprocessor, wherein at least one of first, second or third control electrodes for said arithmetic unit, register and decoder are input, respectively, with a high or a low level voltage, wherein the substrate has an output electrode for issuing a high or a low level voltage according to the voltage applied to said first, second and third control electrodes, and wherein said output electrode issues a voltage at a level based on a plurality of logic operations performed in response to voltage applied to the respective control electrodes.

15. A computer utilizing a semiconductor logic element comprising:

a semiconductor substrate, at least first, second and third control electrodes for applying a high or a low level voltage, respectively, an output electrode for output of a high or a low level voltage in response to applied voltage to said at least first, second, and third control electrodes, respectively, said output electrode outputting a voltage level along with one or more logic operations resulting from applying a voltage to said first, second and third control electrodes, respectively, a tunneling channel between one control electrode and another control electrode selected from the group of said at least first, second, and third control electrodes for applying a high or a low level voltages respectively, a non-tunneling channel between one control electrode and another control electrode selected from the group of said at least first, second, and third control electrodes for applying a high or a low level voltage, respectively, a microprocessor including a controller for controlling an arithmetic unit, register and decoder contained in said microprocessor, and a main memory, an interface including a graphical accelerator, and a computer with paths for connecting said interface with said microprocessor and said main memory, wherein at least one of first, second or third control electrodes for said microprocessor, main memory and interface are input respectively with a high or a low level voltage, wherein said substrate has an output electrode for issuing a high or a low level voltage according to the voltage applied to said first, second and third control electrodes, and said output electrode issues a voltage at a level based on a plurality of logic operations performed in response to voltage applied to the respective control electrodes.

16. A semiconductor logic element comprising:

a collector layer made of a first semiconductor region having a first band gap, a barrier layer made of a second semiconductor region having a second band gap wider than said first band gap, formed on said collector layer, a channel layer made of a third semiconductor region having a third band gap narrower than said second band gap, a carrier supply layer made of a fourth semiconductor region having a fourth band gap wider than a third band gap for supplying carriers to said channel layer, formed on said channel layer, at least a first, a second, and a third control electrode electrically connected to said channel layer, an output electrode electrically connected to said collector layer, a first channel of semiconductor having a first electronegativity, formed between said first and second control electrodes, and a second channel of semiconductor having a second electronegativity larger than the first electronegativity, formed between said first and third control electrodes.

17. A semiconductor logic element comprising:

a substrate, a carrier supply layer made of a first semiconductor region having a first band gap for supplying carriers to a channel layer, formed on said substrate, a channel layer made of a second semiconductor region having a second band gap, narrower, than said first band gap, formed on said carrier supply layer, a barrier layer made of a third semiconductor region having a third band gap wider than said second band gap, formed on said channel layer, a collector layer made of a fourth semiconductor region having a fourth band gap narrower than said third band gap, formed on said barrier layer, at least a first, a second, and a third control electrode electrically connected to said channel layer, an output electrode electrically connected to said collector layer, a first channel of semiconductor having a first electronegativity, formed between said first and second control electrodes, and a second channel of semiconductor having a second electronegativity larger than the first electronegativity, formed between said first and third control electrodes.

18. A semiconductor logic element comprising:

a semiconductor substrate, at least first, second and third control electrodes for applying a high or a low level voltage, respectively, an output electrode for output of a high or a low level voltage in response to applied voltage to said at least first, second, and third control electrodes, respectively, said output electrode outputting a voltage level along with one or more logic operations resulting from applying a voltage to said first, second and third control electrodes, respectively, a tunneling channel between one control electrode and another control electrode selected from the group of said at least first, second, and third control electrodes for applying a high or a low level voltage, respectively, and a non-tunneling channel between one control electrode and another control electrode selected from the group of said at least first, second, and third control electrodes for applying a high or a low level voltage, respectively.

19. A semiconductor logic element according to claim 18 utilized in a full adder.

20. A semiconductor logic element according to claim 18 utilized in an arithmetic unit.

21. A semiconductor logic element according to claim 18 utilized in a register.

22. A semiconductor logic element according to claim 18 utilized in a decoder.

23. A semiconductor logic element according to claim 18 utilized in a memory.

24. A semiconductor logic element according to claim 18 utilized in a graphic accelerator.

25. A semiconductor logic element comprising:

a semiconductor substrate, at least first, second, and third control electrodes for applying a high or a low level voltage, respectively, an output electro de for output of a high or a low level voltage in response to applied voltage to said at least first, second, and third control electrodes, respectively, said output electrode outputting a voltage level along with one or more logic operations resulting from applying a voltage to said first, second and third control electrodes, respectively, a tunneling channel between one control electrode and another control electrode selected from the group of said at least first, second, and third control electrodes for applying a high or a low level voltage, respectively, and a non-tunneling channel between one control electrode and another control electrode selected from th e group of said at least first, second, and third control electrodes for applying a high or a low level voltage, respectively, wherein said output electrode outputs a voltage at a level in response to a first logic operation resulting from applying a voltage to said first and third control electrode in case of applying a fixed low voltage to said second electrode, and said output electrode outputs a voltage at a level in response to a second logic operation differing from the first logic operation and resulting from applying a voltage to said first and third control electrode in case of applying a fixed high voltage to said second electrode.

26. A semiconductor logic element comprising:

a semiconductor substrate, at least first, second, and third control electrodes for applying a high or a low level voltage, respectively, an output electrode for output of a high or a low level voltage in response to applied voltage to said at least first, second, and third control electrodes, respectively, said output electrode outputting a voltage level along with one or more logic operations resulting from applying a voltage to said first, second and third control electrodes, respectively, a first channel having a lower tunneling rate than a second channel between one control electrode and another control electrode selected from the group of said at least first, second, and third control electrodes for applying a high or a low level voltages respectively, and a second channel having a higher tunneling rate than the first channel, the second channel being formed between one control electrode and another control electrode selected from the group of said at least first, second, and third control electrodes for applying a high or a low level voltage, respectively.

* * * * *